(12) United States Patent  (10) Patent No.: US 7,221,028 B2
Yu et al. (45) Date of Patent: May 22, 2007

(54) HIGH VOLTAGE TRANSISTOR AND METHOD OF MANUFACTURING THE SAME

(75) Inventors: Tae-kwang Yu, Suwon-si (KR); Hee-seog Jeon, Hwaseong-si (KR); Seung-beom Yoon, Suwon-si (KR); Yong-tae Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/899,371

(22) Filed: Jul. 26, 2004

(65) Prior Publication Data
US 2005/0035404 A1    Feb. 17, 2005

(30) Foreign Application Priority Data
Aug. 11, 2003    (KR) ...................... 10-2003-0055363

(51) Int. Cl.
    *H01L 29/72*    (2006.01)
(52) U.S. Cl. .................. 257/368; 257/333; 257/387; 257/389; 257/401; 257/408
(58) Field of Classification Search ................ 257/368, 257/333, 387, 389, 401, 408
    See application file for complete search history.

(56) References Cited
U.S. PATENT DOCUMENTS
5,917,218 A    6/1999    Choi et al. .................. 257/345
6,071,775 A    6/2000    Choi et al. .................. 438/257
6,146,952 A *  11/2000   Nariman et al. ............. 438/286
6,596,599 B1 * 7/2003    Guo ........................... 438/305

\* cited by examiner

*Primary Examiner*—Edward Wojciechowicz
(74) *Attorney, Agent, or Firm*—Mills & Onello LLP

(57) ABSTRACT

The present invention relates to a high voltage transistor and method of manufacturing the same. The high voltage transistor includes: a channel region which is formed in a semiconductor substrate; a gate insulating film which is formed on the channel region of the semiconductor substrate; a low concentration source region and a low concentration drain region having the channel region interposed therebetween and each being formed in the semiconductor substrate; a high concentration source region which is formed to be spaced away from the channel region by a first distance; a high concentration drain region which is formed to be spaced away from the channel region by a second distance that is larger than the first distance; a gate electrode which has a gate bottom portion interfacing with the gate insulating film over the channel region, and a gate top portion integrated with the gate bottom portion and protruding by a predetermined length from a top of the gate bottom portion to extend over the low concentration drain region; a first metal silicide layer which is formed on the high concentration source region; and a second metal silicide layer which is formed on the high concentration drain region.

10 Claims, 4 Drawing Sheets

HIGH VOLTAGE TRANSISTOR AND METHOD OF MANUFACTURING THE SAME

BACKGROUND OF THE INVENTION

This application claims the priority of Korean Patent Application No. 2003-55363, filed on Aug. 11, 2003, in the Korean Intellectual Property Office, the contents of which are incorporated herein in their entirety by reference.

1. Field of the Invention

The present invention relates to a semiconductor device and a method of manufacturing the same, and more particularly, to a high voltage transistor used in a peripheral circuit of a flash memory device or an Electrically Erasable and Programmable Read Only Memory (EEPROM) device that is a nonvolatile memory device operating at a high voltage, and a method of manufacturing the same.

2. Description of the Related Art

When a semiconductor integrated circuit directly controls an external system using a high voltage, the integrated circuit requires a high voltage control device to which the external system directly applies the high voltage, and a circuit needing a high breakdown voltage requires a specific high voltage device. For example, since a cell of an EEPROM uses F-N (Fowler-Nordheim) tunneling for operation, a high voltage is required when a program operation or an erase operation is performed. It is essential that a device needing high voltage for operation use a high voltage transistor in a peripheral circuit.

Various technologies required for performing an operation of a nonvolatile memory cell have been proposed for improving the performance of high voltage transistors used in the peripheral circuit. Examples of such technologies are found in U.S. Pat. Nos.: 5,917,218 and 6,071,775).

To allow a drive transistor used to drive the external system having the high voltage directly applied thereto to smoothly drive the external system, a breakdown voltage between a drain of the high voltage transistor and the semiconductor substrate should be greater than a high voltage applied to the drain. An important parameter for determining the breakdown voltage of the drain to which the high voltage is applied is a separation distance between a gate electrode and a high concentration junction.

In one example of the conventional art, a mask islanded double diffused drain (MIDDD) structure is employed in the drain region to elevate the breakdown voltage, thereby implementing a high breakdown voltage junction structure.

FIG. 1 is a sectional view illustrating a principal part of a conventional high voltage transistor 10 employing a MIDDD structure. In FIG. 1, a structure of the high voltage transistor 10 constituting an NMOS transistor is exemplified.

Referring to FIG. 1, a drain region 16 formed in a P-type silicon substrate 12 has a double structure having a low concentration drain region 16a and a high concentration drain region 16b. In this structure, high concentration implantation is performed using a photoresist pattern so as to secure enough separation distance (X1) between the gate electrode 20 and the high concentration drain region 16b.

If the photoresist pattern is used at the time of the high concentration implantation so as to secure the separation distance (X1) between the gate electrode 20 and the high concentration drain region 16b as in the conventional art, a misalign margin (X2) should be considered for the separation distance (X1) and an overlap between the high concentration drain region 16b and a contact 30 in a photolithographic process for forming the photoresist pattern. Accordingly, a layout is required to have a size corresponding to a design rule considering the misalign margin (X2). This causes the high voltage transistor to increase in size.

In a logic transistor, a salicide (self-aligned silicide) process is generally applied to a contact region for a high-speed operation. The salicide process has an advantage in that if it is also applied to the high voltage transistor of the peripheral circuit region, the performance of the high voltage transistor can be improved. However, as exemplified in the conventional art of FIG. 1, if the photoresist pattern is used at the peripheral circuit region to secure the separation distance (X1) between the gate electrode 20 and the high concentration drain region 16b, it is impossible to apply the salicide process for embodying a high speed logic transistor to the entire surface of a wafer. That is because if the salicide process is applied to the high voltage transistor 10 shown in FIG. 1, siliciding is performed up to on a surface of the low concentration drain region 16a such that the low concentration drain region 16a is caused to be directly biased thereby greatly reducing the breakdown voltage.

SUMMARY OF THE INVENTION

The present invention provides a high voltage transistor having enough separation distance between a gate electrode and a high concentration drain region and having a layout not needing consideration of a misalign margin, thereby reducing the transistor size.

Also, the present invention provides a method of manufacturing a high voltage transistor to which a salicide process can be applied to improve a performance of the high voltage transistor used in a peripheral circuit.

According to an aspect of the present invention, there is provided a high voltage transistor including: a channel region which is formed in a semiconductor substrate; a gate insulating film which is formed on the channel region of the semiconductor substrate; a low concentration source region and a low concentration drain region which have the channel region interposed therebetween and are formed in the semiconductor substrate; a high concentration source region which is formed to be spaced away from the channel region by a first distance; a high concentration drain region which is formed to be spaced away from the channel region by a second distance that is larger than the first distance; a gate electrode which has a gate bottom portion interfacing with the gate insulating film over the channel region, and a gate top portion integrated with the gate bottom portion and protruding by a predetermined length from a top of the gate bottom portion to extend over the low concentration drain region; a first metal silicide layer which is formed on the high concentration source region; and a second metal silicide layer which is formed on the high concentration drain region.

In one embodiment, the gate bottom portion and the gate top portion of the gate electrode are formed of polysilicon.

In one embodiment, the inventive high voltage transistor includes a first gate sidewall which constitutes sidewalls of the gate bottom portion and the gate top portion and is positioned adjacent to the high concentration source region; and a second gate sidewall which constitutes sidewalls of the gate bottom portion and the gate top portion and is positioned adjacent to the high concentration drain region, wherein the first gate sidewall and the second gate sidewall have asymmetric structures centering on the channel region.

In one embodiment, the high voltage transistor further includes a first insulating spacer which covers the first gate sidewall; and a second insulating spacer which covers the second gate sidewall.

In one embodiment, the first and second insulating spacers have an asymmetric structure centering on the channel region. The first and second insulating spacers can be formed of a silicon nitride film.

The second insulating spacer can have an extension portion extending from a bottom of the gate top portion up to the gate bottom portion.

The first insulating spacer can have a first bottom surface extending a first width between the gate bottom portion and the first metal silicide layer, and the second insulating spacer has a second bottom surface extending a second width, which is larger than the first width, between the gate bottom portion and the second metal silicide layer.

A third metal silicide layer can be formed on an upper surface of the gate electrode. The first, second and third metal silicide layers can be formed of the same material.

According to another aspect of the present invention, there is provided a method of manufacturing a high voltage transistor, the method including: forming a mask pattern covering a first region on a first conductive semiconductor substrate; forming a gate insulating film on a surface of the semiconductor substrate exposed through the mask pattern; forming a gate electrode asymmetrically extending from an upper surface of the gate insulating film to an upper surface of the mask pattern; removing the mask pattern to expose the first region; implanting a low concentration impurity having a second conductivity opposite to the first conductivity on the resultant semiconductor substrate such that a low concentration source region and a low concentration drain region are formed at both sides of the gate electrode; forming each of asymmetric-structured first insulating spacer and second insulating spacer on both sidewalls of the gate electrode; implanting with a high concentration impurity using the gate electrode, the first insulating spacer and the second insulating spacer as an implant mask to form a high concentration source region and a high concentration drain region; and forming a metal silicide layer on the high concentration source region and the high concentration drain region.

In one embodiment, the mask pattern is formed of a silicon nitride film.

In one embodiment, the gate insulating film is formed using a thermal oxidation process.

In order to form the gate electrode, a conductive layer extending on an entire surface of the gate insulating film and the mask pattern is formed, and the conductive layer is patterned such that the conductive layer remains at a boundary portion of the gate insulating film and the mask pattern.

In one embodiment, the conductive layer is formed of a doped polysilicon.

In one embodiment, removing the mask pattern includes exposing the first region and at the same time exposing a recessed sidewall of the gate electrode at a vicinity of the first region; and the second insulating spacer covers the recessed sidewall at the first region.

In one embodiment, the implanting of the low concentration impurity is performed by a slant implanting method using the gate electrode as an implant mask.

In one embodiment, the first insulating spacer is formed to cover the low concentration source region by a first width, and the second insulating spacer is formed to cover the low concentration drain region by a second width that is larger than the first width.

In one embodiment, a channel is defined between the low condentration source region and the low concentration drain region, the high concentration source region is spaced away from the channel region by a first distance, and the high concentration drain region is spaced away from the channel region by a second distance that is larger than the first distance.

The forming of the metal silicide layer can use a salicide process.

In the present invention, since the salicide process can be performed on the entire surface of the peripheral circuit region together with the memory cell region, a current characteristic, that is, the performance of the high voltage transistor formed on the peripheral circuit region, can be improved. Further, the gate electrode of the high voltage transistor is formed as an asymmetric structure such that enough separation distance can be secured between the gate electrode and the high concentration junction of the drain region, thereby maintaining the high breakdown voltage. Additionally, since the insulating spacer is formed on both sidewalls of the gate electrode and then the high concentration implantation is performed in the self-alignment manner using the insulating spacer to form the source region and the drain region, the conventional misalign margin of the photolithography process does not need to be considered. Accordingly, the layout reduced in size corresponding to a design rule can be obtained with the conventional misalign margin. Furthermore, the source region and the drain region are formed as asymmetric structures with respect to the gate electrode such that the area of the source region can be minimized thereby reducing the transistor in size.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
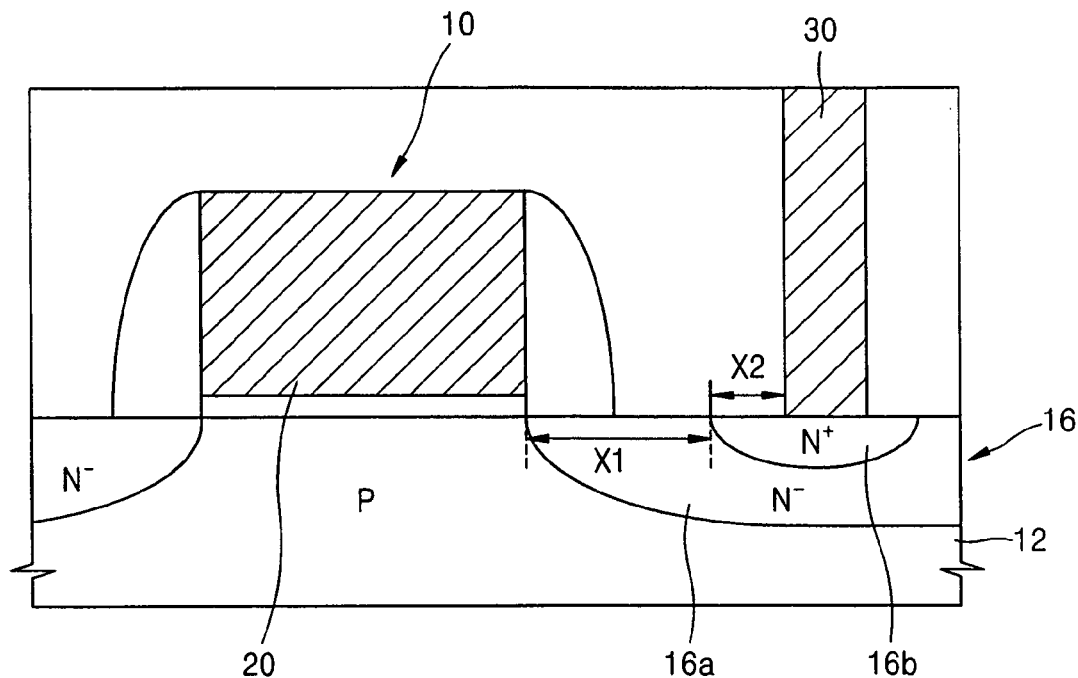
FIG. 1 is a sectional view illustrating a principal part of a conventional high voltage transistor.

The present invention will now be described more fully with reference to the accompanying drawings, in which exemplary embodiments of the invention are shown. In the drawings, the thicknesses of layers and regions are exaggerated for clarity.

FIGS. 2 through 8 are sectional views illustrating a high voltage transistor and a process sequence of a method of manufacturing a high voltage transistor according to an embodiment of the present invention.

The semiconductor substrate includes a memory cell region of a nonvolatile memory device having a plurality of memory cells arrayed in matrix, and the peripheral circuit region. Further, in this embodiment, an NMOS transistor on a P-type semiconductor substrate is exemplified. However, the present invention is not limited to this embodiment, but can be applied to a case where the NMOS transistor can be formed in a P-type well region formed in the semiconductor substrate and can be identically applied to a case where a PMOS transistor is formed in an N-type well region.

Figure 2:
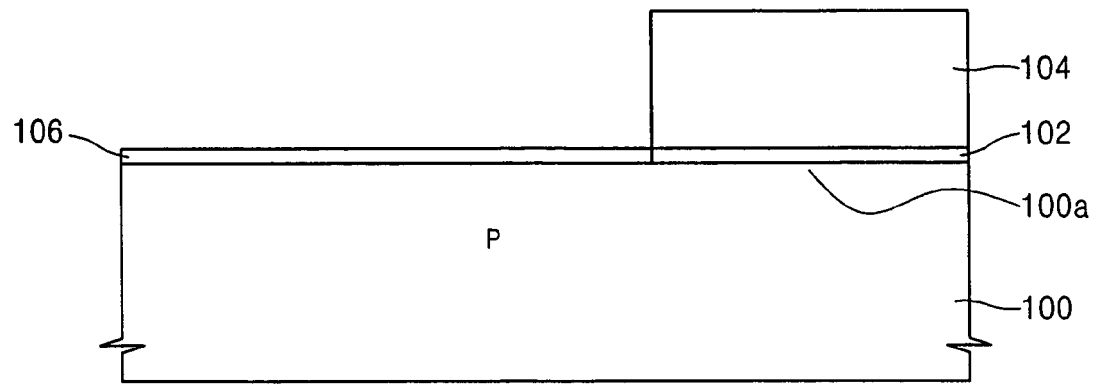
FIGS. 2 through 8 are sectional views illustrating a high voltage transistor and a process sequence of a manufacturing method of the high voltage transistor according to an embodiment of the present invention.

Referring to FIG. 2, after an isolation region (not shown) is formed in a P-type semiconductor substrate 100 to define an active region and a plurality of well regions (not shown) are formed, a mask layer is deposited on an entire surface of a pad oxide film 102 remaining on the semiconductor substrate 100. The mask layer is formed to have a thickness selected from a range of about 1000 to 5000 Å. For example, the mask layer is formed to have a thickness of about 2000 Å. It is desirable that the mask layer be formed of a silicon nitride film. The mask layer is patterned to form a mask pattern 104 covering a first region 100a having a drain region formed in the semiconductor substrate 100 through a subsequent process.

The pad oxide film 102 not covered by the mask pattern 104 is removed exposing a surface of the semiconductor substrate 100 and leaving the first region 100a, and a gate insulating film 106 is formed using a thermal oxidation process on the surface of the semiconductor substrate 100. The gate insulating film 106 is formed to have a relatively heavy thickness such that it is adapted for the structure of the high voltage transistor. For example, the gate insulating film 106 can be formed to have a thickness of about 250 to 300 Å.

Figure 3:
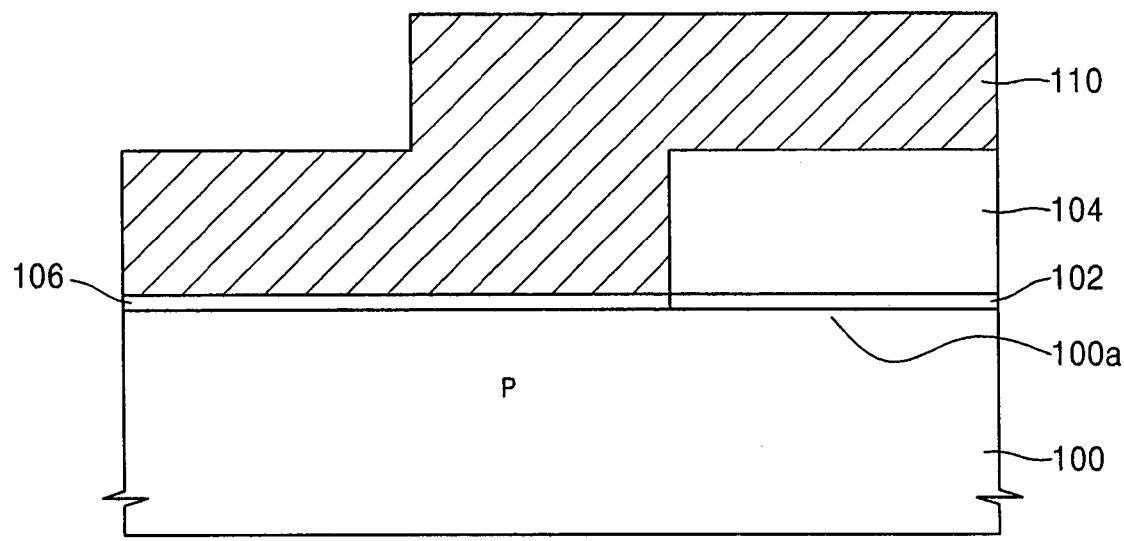

Referring to FIG. 3, a conductive layer 110 is formed to extend over the entire surface of the gate insulating film 106 and the mask pattern 104, to have a thickness of about 1000 to 2000 Å. The conductive layer 110 is formed of doped polysilicon.

Figure 4:
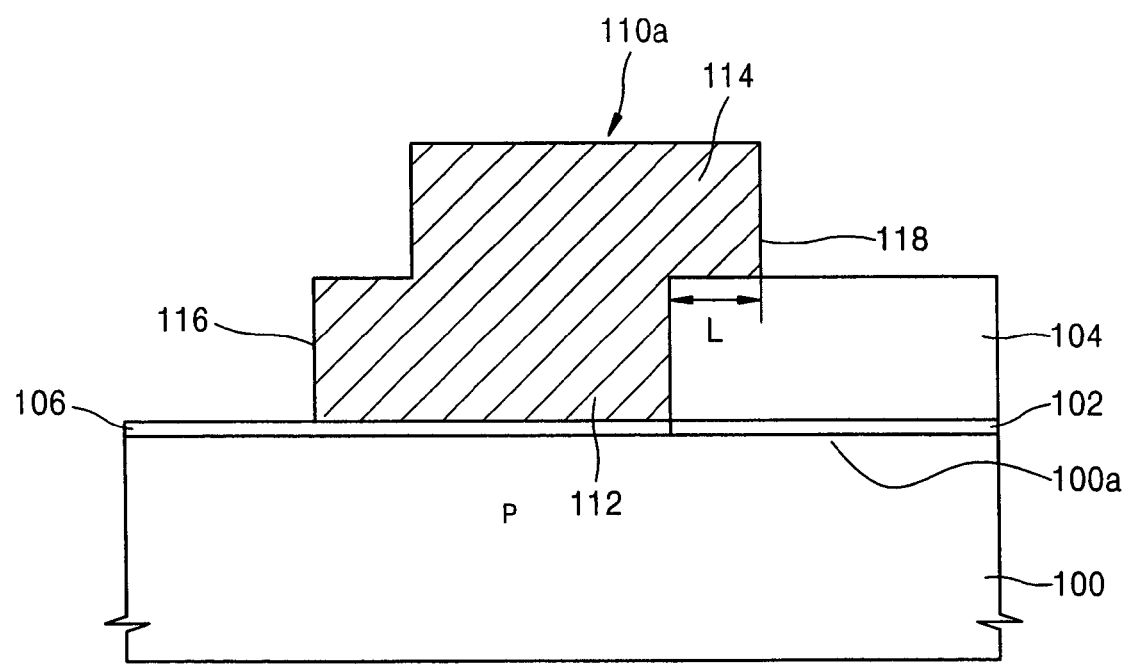

Referring to FIG. 4, the conductive layer 110 is patterned to form a gate electrode 110a at a boundary portion between the gate insulating film 106 and the mask pattern 104. The gate electrode 100a includes a gate bottom portion 112 interfaced with the top of the gate insulating film 106 and a gate top portion 114 integrated with the gate bottom portion 112 and protruding by a certain length (L) from the top portion of the gate bottom portion 112 toward the first region 100a, to extend over the first region 100a. The gate electrode 110a has an asymmetric shape extending from an upper surface of the gate insulating film 106 to an upper surface of the mask pattern 104. Further, the gate electrode 110a has asymmetric-structured first gate sidewall 116 and second gate sidewall 118.

Figure 5:
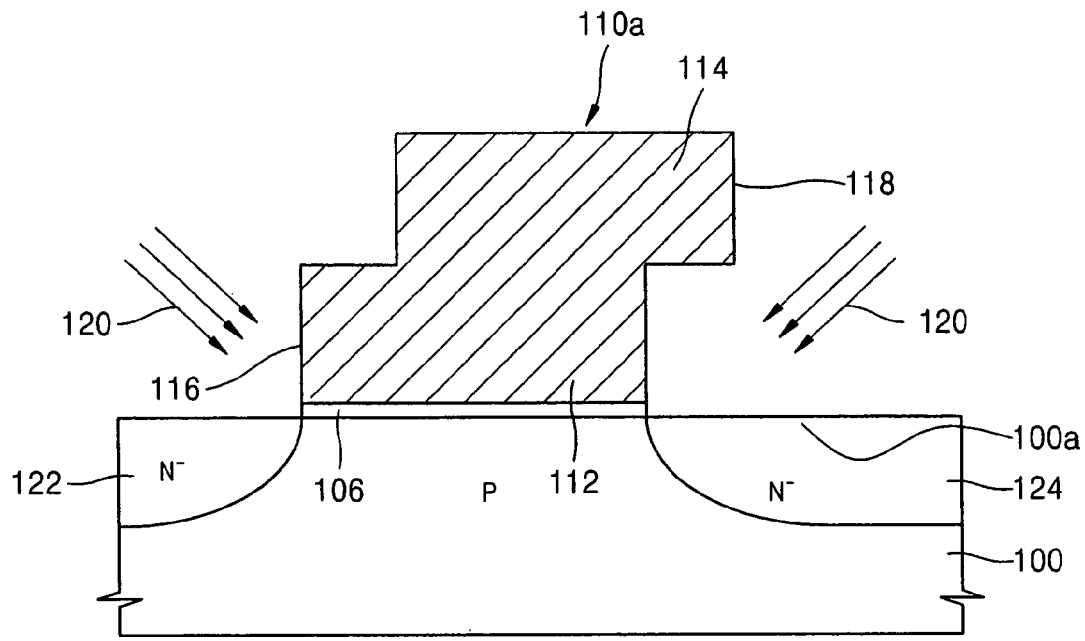

Referring to FIG. 5, the mask pattern 104 is removed to expose the first region 100a. For example, in order to remove the mask pattern 104, a wet etching process can be performed using a phosphoric acid solution. When the mask pattern 104 is removed, the oxides remaining on the upper surface of the semiconductor substrate 100 are together removed at the periphery of the gate electrode 110a. By removing the mask pattern 104, the first region 100a is exposed and at the same time, the second gate sidewall 118 recessed in the vicinity of the first region 100a is exposed.

Then, the gate electrode 110a is used as an ion implant mask to implant and anneal N$^-$-type impurity ions 120 at both sides of the gate electrode 110a such that a low concentration source region 122 and a low concentration drain region 124 are formed in the semiconductor substrate 100. A slant implanting method is used to implant impurity ions up to the first region 100a positioned under a protrusion portion of the gate top portion 114.

Figure 6:
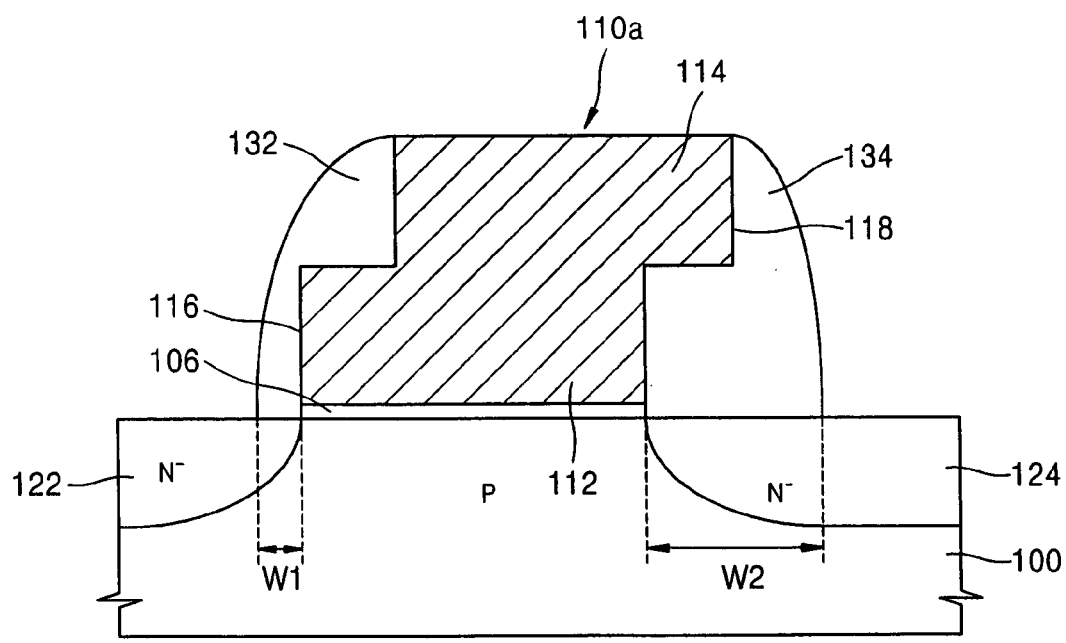

Referring to FIG. 6, an asymmetric-structured first insulating spacer 132 and a second insulating spacer 134 are formed on the first gate sidewall 116 and the second gate sidewall 118, respectively, of the gate electrode 110a. In order to form the first insulating spacer 132 and the second insulating spacer 134, a silicon nitride film is formed on an entire resultant surface of the structure illustrated in FIG. 5, and an etch-back method is again performed. Here, the second insulating spacer 134 is formed to cover the second gate sidewall 118 recessed above the first region 100a.

The gate electrode 110a, the first insulating spacer 132 and the second insulating spacer 134 each have an asymmetric structure such that the first insulating spacer 132 is formed to cover the low concentration source region 122 by a first width (W1), and the second insulating spacer 134 is formed to cover the low concentration drain region 124 by a second width (W2) larger than the first width (W1).

Figure 7:
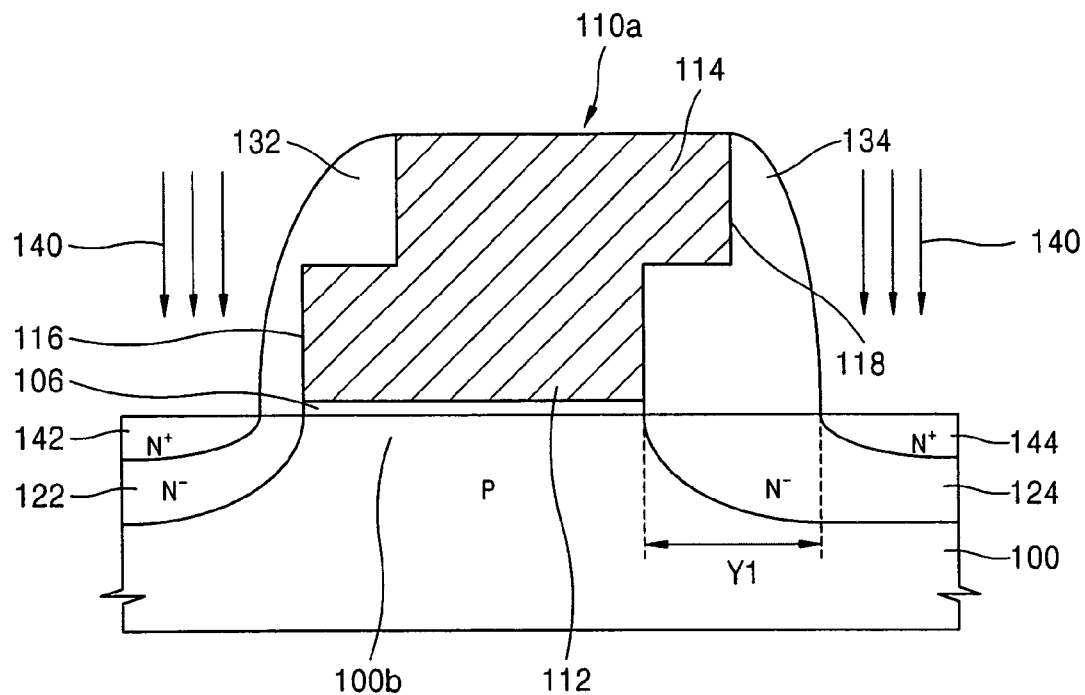

Referring to FIG. 7, N$^+$-type impurity ions 140 are implanted using the gate electrode 110a, the first insulating spacer 132 and the second insulating spacer 134 as the implant mask to form the high concentration source region 142 and the high concentration drain region 144. As a result, the drain region has a double diffused drain (DDD) structure having enough separation distance (Y1) between the gate electrode 110a and the high concentration drain region 144.

In the high concentration source region 142 and the high concentration drain region 144 having a channel region 100b interposed therebetween and defined between the low concentration source region 122 and the low concentration drain region 124, a distance between the channel region 100b and the high concentration drain region 144 is larger than a distance between the channel region 100b and the high concentration source region 142.

Figure 8:
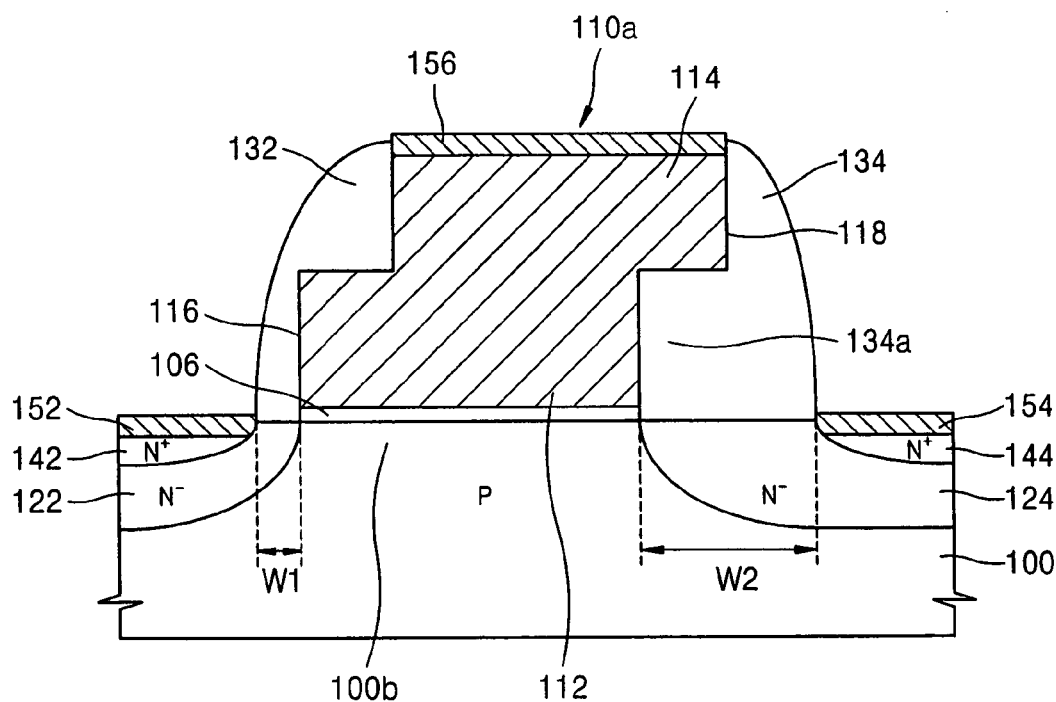

Referring to FIG. 8, a general salicide process is used to form first, second, third metal silicide layers 152, 154 and 156 on a surface of the high concentration source region 142, a surface of the high concentration drain region 144 and an upper surface of the gate electrode 110a, respectively. The first, second and third metal silicide layer 152, 154 and 156 are simultaneously formed of the same material. For example, they can be formed of a cobalt silicide layer or a titanium silicide layer.

In a structure of FIG. 8, a source region is comprised of the low concentration source region 122 and the high concentration source region 142, and a drain region is comprised of the low concentration drain region 124 and the high concentration drain region 144. The source region and the drain region have the channel region 100b interposed therebetween and are formed in the semiconductor substrate 100. The first gate sidewall 116 adjacent to the source region and the second gate sidewall 118 adjacent to the drain region have an asymmetric structure with regard to the center of the channel region 110b. Further, the first insulating spacer 132 and the second insulating spacer 134 also have an asymmetric structure with respect to the center on the channel region 100b.

The second insulating spacer 134 includes an extension portion 134a extending from the bottom of the gate top portion 114 up to the gate bottom portion 112.

Further, the first insulating spacer 132 has a bottom surface extending a first width (W1) between the gate bottom portion 112 and the first metal silicide layer 152, and the second insulating spacer 134 has a bottom surface extending a second width (W2), which is larger than the first width (W1), between the gate bottom portion 112 and the second metal silicide layer 154.

In the above structure, the gate electrode 110a is formed as an asymmetric structure such that enough separation distance can be secured by the second width (W2) between the gate electrode 110a and the high concentration drain region 144 thereby maintaining a high breakdown voltage. Further, since the first insulating spacer 132 and the second insulating spacer 134 allow the high concentration implantation to be performed in a self-aligned manner, a conventional misalign margin of a photolithography process does not need to be considered. Accordingly, the layout reduced in size correspondingly to a design rule can be obtained with the conventional misalign margin. Additionally, the source region and the drain region are formed as asymmetric structures centering on the gate electrode 110a such that an area of the source region is minimized thereby reducing the transistor in size. Further, it is possible to perform the salicide process for forming the first, second and third metal silicide layers 152, 154 and 156 when a salicide process is performed at the time of forming a logic transistor. That is, the salicide process can be performed on an entire surface of a wafer including the memory cell region of an EEPROM device and the peripheral circuit region.

In the present invention, since the salicide process can be performed on the entire surface of the peripheral circuit region together with the memory cell region, a current characteristic, that is, a performance of the high voltage transistor formed on the peripheral circuit region can be improved. Further, the gate electrode of the high voltage transistor is formed as an asymmetric structure such that enough separation distance can be secured between the gate electrode and the high concentration junction of the drain region thereby maintaining the high breakdown voltage. Specifically, since the insulating spacer is formed on both sidewalls of the gate electrode and then the high concentration implantation is performed using self-alignment manner using the insulating spacer to form the source region and the drain region, the conventional misalign margin of the photolithography process does not need to be considered. Accordingly, the layout reduced in size correspondingly to a design rule can be obtained with the conventional misalign margin. Furthermore, the source region and the drain region are formed as asymmetric structures centering on the gate electrode such that the area of the source region can be minimized thereby reducing the transistor in size.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high voltage transistor comprising:
   a channel region which is formed in a semiconductor substrate;
   a gate insulating film which is formed on the channel region of the semiconductor substrate;
   a low concentration source region and a low concentration drain region which have the channel region interposed therebetween and are formed in the semiconductor substrate;
   a high concentration source region which is formed to be spaced away from the channel region by a first distance;
   a high concentration drain region which is formed to be spaced away from the channel region by a second distance larger than the first distance;
   a gate electrode which has a gate bottom portion interfacing with the gate insulating film over the channel region, and a gate top portion integrated with the gate bottom portion and protruding by a predetermined length from a top of the gate bottom portion to extend over the low concentration drain region;
   a first metal silicide layer which is formed on the high concentration source region;
   a second metal silicide layer which is formed on the high concentration drain region; and
   asymmetric first and second spacers each having first sides abutting sidewalls of the gate top portion and the gate bottom portion of the gate electrode, wherein the first spacer has a second side that is positioned between the low concentration source region and the first metal silicide layer and the second spacer has a second side that is positioned between the low concentration drain region and the second metal silicide layer.

2. The high voltage transistor of claim 1, wherein the gate bottom portion and the gate top portion of the gate electrode are each formed of doped polysilicon.

3. The high voltage transistor of claim 1, further comprising:
   a first gate sidewall which constitutes the sidewalls of the gate bottom portion and the gate top portion and is positioned adjacent to the high concentration source region; and
   a second gate sidewall which constitutes the sidewalls of the gate bottom portion and the gate top portion and is positioned adjacent to the high concentration drain region,
   wherein the first gate sidewall and the second gate sidewall have asymmetric structures centering on the channel region.

4. The high voltage transistor of claim 1, further comprising:
   a first gate sidewall which constitutes the sidewalls of the gate bottom portion and the gate top portion and is positioned adjacent to the high concentration source region; and
   a second gate sidewall which constitutes the sidewalls of the gate bottom portion and the gate top portion and is positioned adjacent to the high concentration drain region; wherein
   the first spacer is a first insulating spacer which covers the first gate sidewall; and wherein
   the second spacer is a second insulating spacer which covers the second gate sidewall.

5. The high voltage transistor of claim 4, wherein the first and second insulating spacers are formed of a silicon nitride film.

6. The high voltage transistor of claim 4, wherein the first and second insulating spacers have asymmetric structures centering on the channel region.

7. The high voltage transistor of claim 4, wherein the second insulating spacer has an extension portion extending from a bottom of the gate top portion up to the gate bottom portion.

8. The high voltage transistor of claim 4, wherein the first insulating spacer has a first bottom surface extending a first width between the gate bottom portion and the first metal silicide layer, and the second insulating spacer has a second bottom surface extending a second width, which is larger than the first width, between the gate bottom portion and the second metal suicide layer.

9. The high voltage transistor of claim 1, further comprising a third metal silicide layer formed on an upper surface of the gate electrode.

10. The high voltage transistor of claim 9, wherein the first, second and third metal suicide layers are each formed of the same material.

* * * * *

UNITED STATES PATENT AND TRADEMARK OFFICE
CERTIFICATE OF CORRECTION

PATENT NO. : 7,221,028 B2 Page 1 of 1
APPLICATION NO. : 10/899371
DATED : May 22, 2007
INVENTOR(S) : Tae-kwang Yu It is certified that error appears in the above-identified patent and that said Letters Patent is hereby corrected as shown below:

Column 8, line 49 delete "suicide" and insert --silicide--

Column 8, line 54 delete "suicide" and insert --silicide--

Signed and Sealed this

Thirtieth Day of October, 2007

JON W. DUDAS
*Director of the United States Patent and Trademark Office*